United States Patent
Jung et al.

(10) Patent No.: US 9,425,243 B2
(45) Date of Patent: Aug. 23, 2016

(54) ORGANIC LIGHT EMITTING DISPLAY PANEL

(71) Applicant: LG Display Co., Ltd., Seoul (KR)

(72) Inventors: Kyoung-June Jung, Pocheon-si (KR); Donghyun Yeo, Suwon-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/583,993

(22) Filed: Dec. 29, 2014

(65) Prior Publication Data

US 2016/0035808 A1 Feb. 4, 2016

(30) Foreign Application Priority Data

Jul. 30, 2014 (KR) .................. 10-2014-0097297

(51) Int. Cl.
*H01L 27/32* (2006.01)
*H01L 51/56* (2006.01)

(52) U.S. Cl.
CPC ........ *H01L 27/3265* (2013.01); *H01L 27/3262* (2013.01); *H01L 27/3276* (2013.01); *H01L 51/56* (2013.01)

(58) Field of Classification Search
CPC ............ H01L 27/3265; H01L 27/3262; H01L 27/3276; H01L 51/56
See application file for complete search history.

(56) References Cited

U.S. PATENT DOCUMENTS

| | | | | |
|---|---|---|---|---|
| 7,435,629 B2 * | 10/2008 | Youn | ................ | G02F 1/1362 257/59 |
| 7,541,225 B2 * | 6/2009 | Baek | ................ | H01L 27/1214 257/E21.7 |
| 7,622,316 B2 * | 11/2009 | Park | ................ | H01L 27/1255 257/E21.413 |
| 7,824,952 B2 * | 11/2010 | Choi | ................ | H01L 27/1229 257/40 |
| 8,879,011 B2 * | 11/2014 | Yamazaki | ........... | H01L 27/1225 349/19 |
| 2009/0128722 A1 * | 5/2009 | Kim | ................ | G09G 3/3648 349/37 |
| 2010/0006844 A1 * | 1/2010 | Kim | ................ | H01L 27/1288 257/59 |
| 2010/0051956 A1 * | 3/2010 | You | ................ | H01L 27/1288 257/72 |
| 2013/0222355 A1 * | 8/2013 | Choi | ................ | G09G 3/348 345/211 |
| 2013/0235018 A1 * | 9/2013 | Tanaka | ................ | G09G 3/3446 345/212 |
| 2014/0042428 A1 * | 2/2014 | Ning | ................ | H01L 29/66969 257/43 |
| 2014/0062331 A1 * | 3/2014 | Nam | ................ | G09G 3/3233 315/226 |
| 2014/0291636 A1 * | 10/2014 | Kim | ................ | H01L 27/3262 257/40 |
| 2015/0123114 A1 * | 5/2015 | Lim | ................ | H01L 27/124 257/43 |
| 2015/0269894 A1 * | 9/2015 | Shin | ................ | G09G 3/3426 345/690 |
| 2015/0371609 A1 * | 12/2015 | Choi | ................ | G09G 3/2092 345/205 |
| 2016/0005355 A1 * | 1/2016 | Wen | ................ | G09G 3/2025 345/205 |

* cited by examiner

*Primary Examiner* — Ida M Soward
(74) *Attorney, Agent, or Firm* — Morgan, Lewis & Bockius LLP

(57) ABSTRACT

An organic light emitting display panel includes: a pixel defined by an intersection of one of a plurality of data lines and one of a plurality of gate lines, the pixel including: a transistor, a storage capacitor including: a first electrode, and a second electrode, and a semiconductor layer, a first plate partially overlapping the semiconductor layer in the pixel, the first plate including: a gate portion of the transistor, and a capacitor-forming portion including the first electrode of the storage capacitor, and a second plate on the first plate in the pixel, the second plate including the second electrode of the storage capacitor, the second plate not overlapping the semiconductor layer.

10 Claims, 11 Drawing Sheets

SEMICONDUCTOR LAYER FORMATION AREA

ORGANIC LIGHT EMITTING DISPLAY PANEL

CROSS-REFERENCE TO RELATED APPLICATION(S)

The present application claims benefit and priority under 35 U.S.C. §119(a) of Korean Patent Application No. 10-2014-0097297, filed on Jul. 30, 2014, the entire disclosure of which is hereby incorporated by reference herein for all purposes.

BACKGROUND

1. Technical Field

The following description relates to an organic light emitting display panel and a method of manufacturing the same.

2. Discussion of the Related Art

In the field of flat display devices, liquid crystal display devices have been widely used due to their relatively light weight and low power consumption. However, because the liquid crystal display device is a non-emissive device that cannot emit light by itself, it has limitations in brightness, contrast ratio, viewing angle, and screen size.

Accordingly, development of new types of flat display devices is in progress to address the limitations of the typical liquid crystal display devices. An organic light emitting display device, one of the new types of flat display devices, is an emissive device that is able to emit light by itself ("self-emissive"), so the organic light emitting display device may provide higher brightness, a wider viewing angle, and an improved contrast ratio, compared to the liquid crystal display device. Furthermore, because the organic light emitting display device does not require a backlight, it is advantageous for making lightweight and thin displays, as well as for saving on power consumption.

An organic light emitting display panel of the organic light emitting display device displays images by using light emitted from an organic light emitting element that is connected with a thin film transistor of each pixel area. In the organic light emitting element, an organic light emitting layer made of an organic material between an anode and a cathode emits a light by applying an electric field thereto. The organic light emitting display panel has features including a low driving voltage, low power consumption, and light weight. Further, the organic light emitting display panel can be applied on a flexible substrate.

However, the organic light emitting display panel may bring about an increase in driving voltage and leakage current due to degradation in the electric property of the transistor to thereby create black dots on the panel.

SUMMARY

Accordingly, embodiments of the present application are directed to an organic light emitting display panel and a method of manufacturing the same that substantially obviate one or more problems due to limitations and disadvantages of the related art.

An object of embodiments is to provide an organic light emitting display panel by which degradation of the electric property of the transistor may be prevented to thereby reduce the driving voltage and leakage current and prevent the creation of the black dots.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose according to one aspect of the invention, there is provided an organic light emitting display panel, including: a pixel defined by an intersection of one of a plurality of data lines and one of a plurality of gate lines, the pixel including: a transistor, a storage capacitor including: a first electrode, and a second electrode, and a semiconductor layer, a first plate partially overlapping the semiconductor layer in the pixel, the first plate including: a gate portion of the transistor, and a capacitor-forming portion including the first electrode of the storage capacitor, and a second plate on the first plate in the pixel, the second plate including the second electrode of the storage capacitor, the second plate not overlapping the semiconductor layer.

In another aspect, there is provided a method of manufacturing an organic light emitting display panel, the method including: providing a pixel defined by an intersection of one of a plurality of data lines and one of a plurality of gate lines, the providing the pixel including: providing a transistor, providing a storage capacitor including: a first electrode, and a second electrode, and providing a semiconductor layer, providing a first plate partially overlapping the semiconductor layer in the pixel, the providing a first plate including: providing a gate portion of the transistor, and providing a capacitor-forming portion including the first electrode of the storage capacitor, and providing a second plate on the first plate in the pixel, the second plate including the second electrode of the storage capacitor, the second plate not overlapping the semiconductor layer.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, which are included to provide a further understanding of the invention and are incorporated in and constitute a part of this specification, illustrate implementations of the invention and together with the description serve to explain the principles of the invention.

Figure 1:
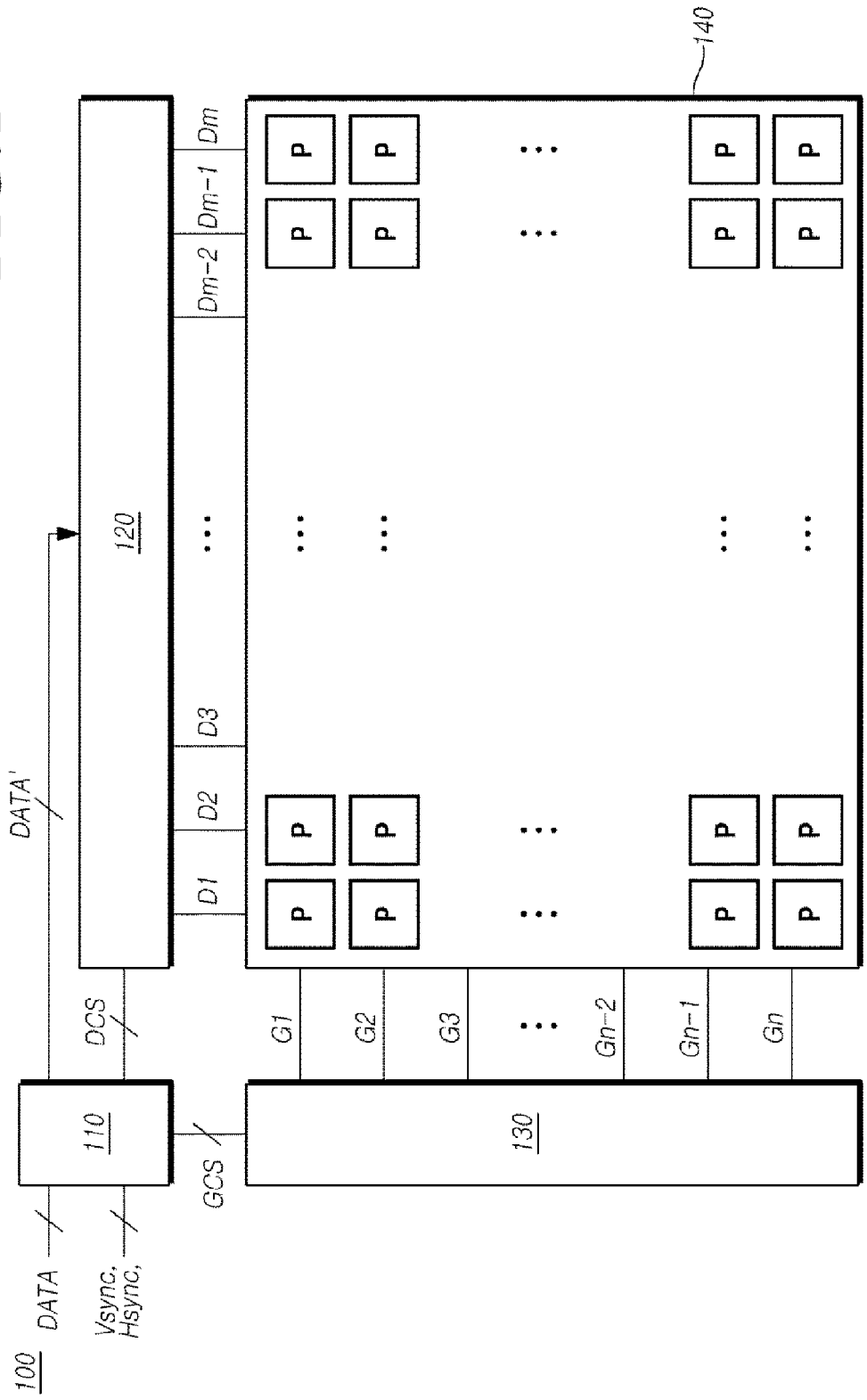
FIG. 1 illustrates a block diagram of a system configuration of an organic light emitting display device according to an embodiment.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present invention, examples of which are illustrated in the accompanying drawings. In the following description, when a detailed description of well-known functions or configurations related to this document is determined to unnecessarily cloud a gist of the invention, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

Hereinafter, embodiments will be described in detail with reference to the accompanying drawings.

FIG. 1 illustrates a block diagram of a system configuration of an organic light emitting display device according to an embodiment.

With reference to FIG. 1, the organic light emitting display device 100 may include an organic light emitting display panel 140, a data driving unit 120, a gate driving unit 130, and a timing controller 110. First, the timing controller 110 may output a data control signal DCS for controlling the data driving unit 120 and a gate control signal GCS for controlling the gate driving unit 130. The data control signal DCS and gate control signal GCS may be based on external timing signals, such as vertical/horizontal synchronization signals Vsync and Hsync and image data DATA input from a host system, a clock signal CLK, or the like. Further, the timing controller 110 may transform the image data DATA input from the host system into data signals to be used in the data driving unit 120, and may supply the transformed image data DATA' to the data driving unit 120.

In response to data control signals DCS and the transformed image data DATA', which may be input from the timing controller 110, the data driving unit 120 may transform the image data DATA' into data signals (analog pixel signals or data voltages), which are voltages corresponding to gradation, to supply the same to data lines D1 to Dm. The gate driving unit 130 may supply scan signals (gate pulses, scan pulses or gate-on-signals) to gate lines G1 to Gn in sequence, in response to the gate control signals GCS input from the timing controller 110.

Meanwhile, a pixel P on the organic light emitting display panel 140 may be provided in a pixel area defined by the data lines D1 to Dm and the gate lines G1 to Gn in a matrix, and may be at least one organic light emitting element including a pixel electrode (e.g., an anode) as the first electrode, a common electrode (e.g., a cathode) as the second electrode, and an organic layer. Each pixel P may be provided with a gate line G1 to Gn, a data line D1 to Dm, and a high voltage line for supplying a high voltage. Further, a switching transistor may be provided between the gate lines G1 to Gn and the data lines D1 to Dm in each pixel. Further, an organic light emitting diode (which may include an anode, a cathode, and an organic light emitting layer) and a driving transistor (between the a source electrode (or drain electrode) of the switching transistor and the high voltage line) are formed in the pixel.

In the driving transistor of the organic light emitting display panel 140 according to an embodiment, the first plate that is positioned on a semiconductor layer may overlap the semiconductor layer at least in part. However, the second plate, which is positioned on the first plate and forms a storage capacitor together with the first plate, does not overlap the semiconductor layer, which will be described in detail below.

Figure 2:
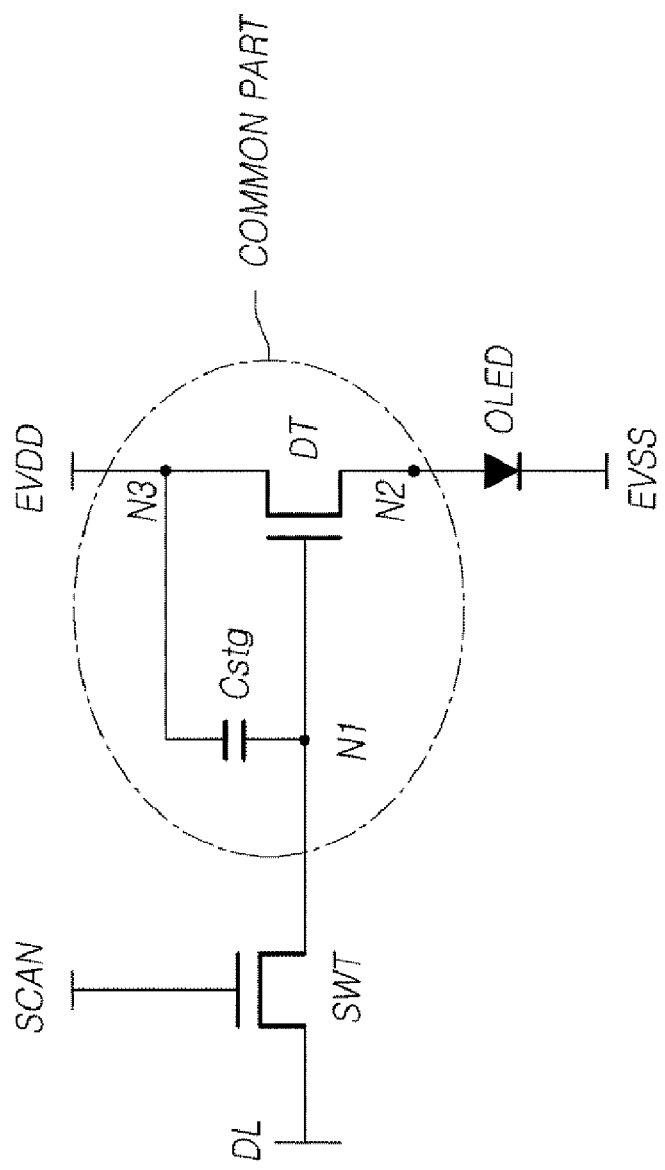
FIG. 2 illustrates a circuit diagram of an example of a pixel structure of an organic light emitting display panel according to an embodiment.

FIG. 2 illustrates a circuit diagram of an example of a pixel structure of an organic light emitting display panel 140 according to an embodiment.

FIG. 2 shows an example of an equivalent circuit diagram of a structure of two transistors (i.e., "2T") and one capacitor (i.e., "1C"). With reference to FIG. 2, each pixel may be connected with a single data line DL, and may receive a single scan signal SCAN through the single gate line GL.

The pixel may include an organic light emitting diode OLED, a driving transistor DT, a switching transistor SWT, and a storage capacitor Cstg. As set forth above, each pixel may have a 2T-1C structure in which two transistors DT, SWT and one storage capacitor Cstg are provided. The driving transistor DT in each pixel may be applied with a driving voltage EVDD from a driving voltage line (DVL), and may drive the organic light emitting diode OLED under the control by a voltage (data voltage) of a gate node N2, which may be applied through the switching transistor SWT.

The driving transistor DT may be connected to the first node N1, the second node N2, and the third node N3. The first node N1 may be connected with the switching transistor SWT, and the second node N2 may be connected with the driving transistor DT. Further, the third node N3 may be supplied with the driving voltage EVDD. The pixel structure of the organic light emitting display panel 140, according to embodiments, is not limited to the above 2T-1C structure, and may be, for example, a 3T-1C structure, which will be described with reference to FIG. 3.

Figure 3:
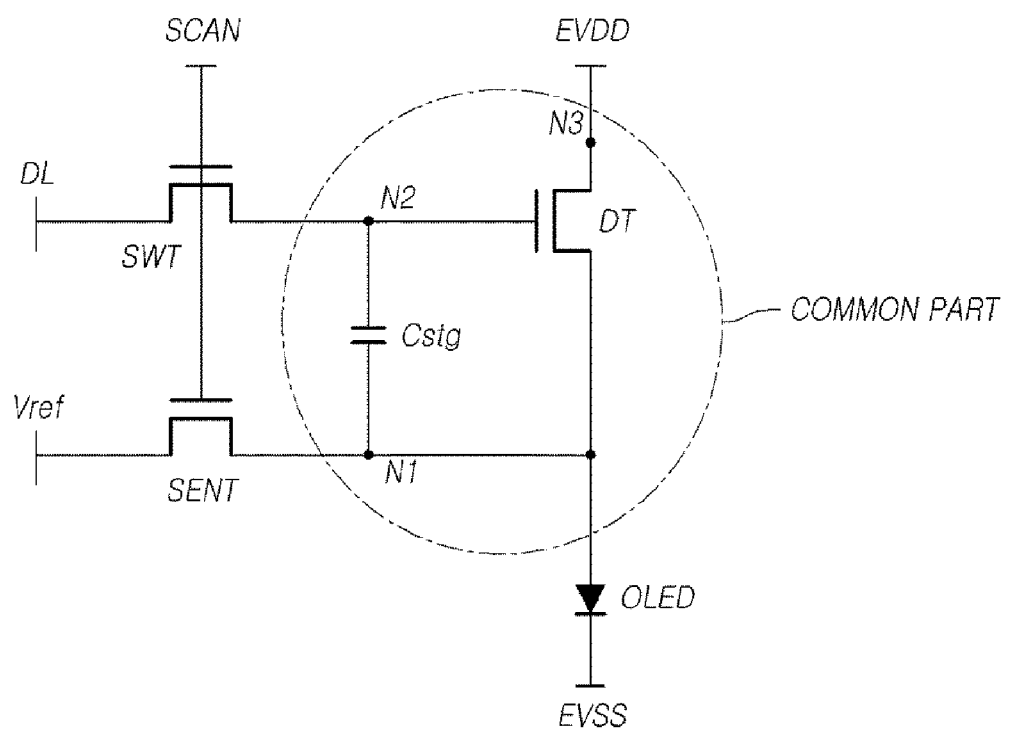
FIG. 3 illustrates a circuit diagram of an example of a pixel structure of an organic light emitting display panel according to an embodiment.

FIG. 3 illustrates a circuit diagram of an example of a pixel structure of an organic light emitting display panel 140 according to an embodiment.

With reference to the FIG. 3 example showing a 3T-1C structure, the pixel structure may include an organic light emitting diode OLED, a driving transistor DT, a switching transistor SWT, a sensing transistor SENT, and a storage capacitor Cstg. The driving transistor DT in each pixel may be applied with a driving voltage EVDD from a driving voltage line (DVL), and may drive the organic light emitting diode OLED under the control of a voltage (data voltage) of a gate node N2 applied through the switching transistor SWT.

The driving transistor DT may be connected to the first node N1, the second node N2, and the third node N3. The first node N1 may be connected with the sensing transistor SENT, and the second node N2 may be connected with the switching transistor SWT. Further, the third node N3 may be supplied with the driving voltage EVDD.

As an example, the first node of the driving transistor DT may be, e.g., a source node (or referred to as a "source electrode"), and the second node thereof may be a gate node (or referred to as a "gate electrode"). Further, the third node N3 of the driving transistor DT may be a drain node (or referred to as a "drain electrode"). The first node, the second node and the third node of the driving transistor DT may be changed according to the change in the type and circuits of the transistor.

In addition, the sensing transistor SENT may be controlled by a scan signal SCAN supplied from the gate line GL, and may be connected between the first node N1 of the driving transistor DT and either the reference voltage line (RVL) for supplying the reference voltage or a connection pattern (CP) connected with the reference voltage line (RVL). In addition, the switching transistor SWT may be controlled by a common scan signal SCAN supplied from the gate line GL, and may be connected between the corresponding data line DL and the second node N2 of the driving transistor DT. Further, the storage capacitor Cstg may be connected between the first node N1 and the second node N2 of the driving transistor DT, and may play the role of maintaining the data voltage for one frame.

As described above, the sensing transistor SENT and the switching transistor SWT may be controlled by a single scan signal supplied through the same gate line (common gate line). With regard to a single scan structure based on 3T-1C, basically, the sensing transistor SENT may be related to a "driving" so that the sensing transistor SENT may apply a data voltage to the second node N2 of the driving transistor DT. Further, the switching transistor SWT may be related to a "sensing" in order to compensate the difference of brightness between pixels as well as the "driving." Meanwhile, the pixel structure of the organic light emitting display panel 140, according to an embodiment, may include a "signal line connection structure," by which the pixel is connected with various signal lines, such as the data line DL, the gate line GL, the driving voltage line DVL, the reference voltage line RVL, or the like, as well as the "basic pixel structure (single scan structure of 3T-1C)," as described in the FIG. 2 example.

In one example, the various signal lines may include the data line for supplying the data voltage to each pixel, the gate line for supplying the scan signal, the reference voltage line (RVL) for supplying the reference voltage Vref to each pixel and the driving voltage line (DVL) for supplying the driving voltage EVDD. Meanwhile, the pixel structure of the organic light emitting display panel 140, according to an embodiment, is not limited to the above structures, and may be implemented in various structures.

Figure 4:
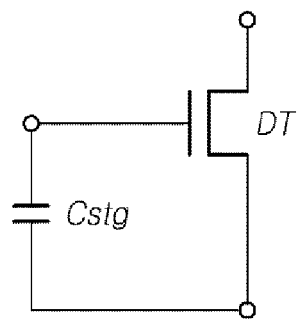
FIG. 4 illustrates a circuit diagram of a common part in various example pixel structures of an organic light emitting display panel according to an embodiment.

FIG. 4 illustrates a circuit diagram of a common part in various example pixel structures of an organic light emitting display panel 140 according to an embodiment.

The common part of the pixel structure is shown in FIGS. 2 and 3 and is labeled as "COMMON PART." The configuration that is in common with the various pixel structures is illustrated in FIG. 4.

With reference to FIG. 4, the various pixel structures include the driving transistor DT and the storage capacitor Cstg in common. The upper plate or the lower plate of the storage capacitor Cstg may be connected with the gate of the driving transistor DT, and the lower plate or the upper plate of the storage capacitor Cstg may be electrically connected with the source electrode or the drain electrode of the driving transistor DT.

Until now, the examples of the pixel structures of the organic light emitting display panel 140, to which embodiments are applied, have been described. Hereinafter, the structure of the organic light emitting display panel 140, according to embodiments, will be described in further detail.

Figure 5:
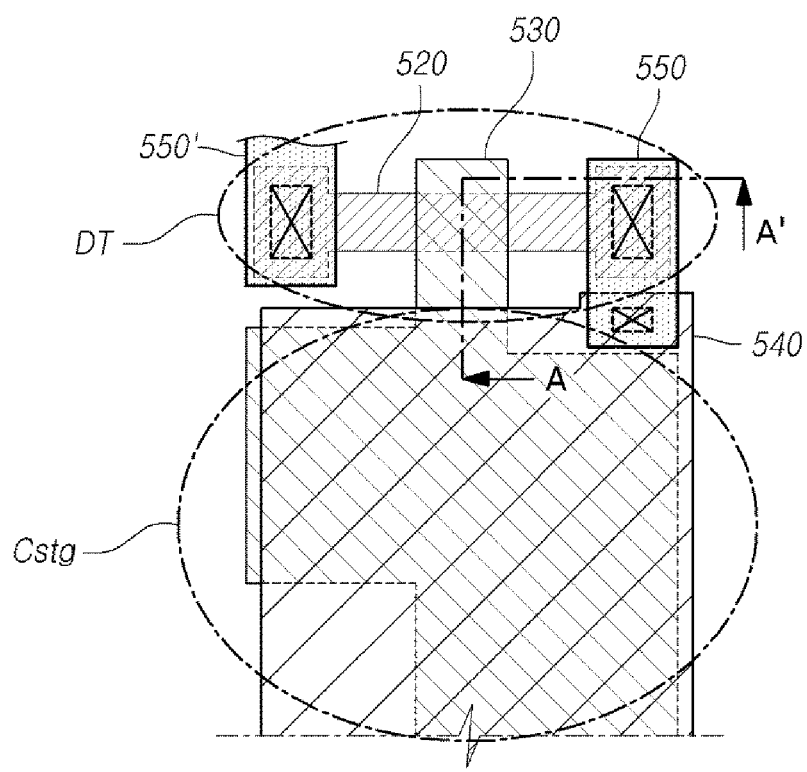
FIG. 5 is a partial plan view illustrating a pixel of an organic light emitting display panel 140 according to an embodiment.
Figure 6:
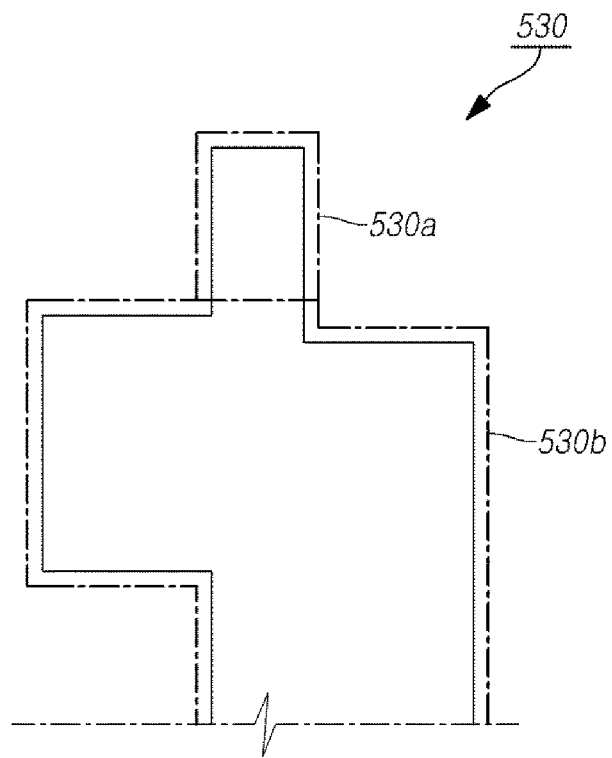
FIG. 6 illustrates a partial structure of the first plate 530 in the pixel of the organic light emitting display panel 140 of FIG. 5.

FIG. 5 is a partial plan view illustrating a pixel of an organic light emitting display panel 140 according to an embodiment. FIG. 6 illustrates a partial structure of the first plate 530 in the pixel of the organic light emitting display panel 140 of FIG. 5.

FIG. 5 shows the common part that is provided in various pixel structures of the organic light emitting display panel 140. It should be noted that other elements may be designed in various structures.

With reference to the examples of FIGS. 5 and 6, the organic light emitting display panel 140, according to an embodiment, may include pixels P that are defined by the respective intersections of a plurality of data lines D1 to Dm and a plurality of gate lines G1 to Gn. Each pixel P includes the transistor DT and the storage capacitor Cstg. Each pixel P may further include a semiconductor layer 520, the first plate 530 on the semiconductor layer 520 (which may be formed with a gate portion 530a of the transistor DT and a capacitor-forming portion 530b as the first electrode of the storage capacitor Cstg) and the second plate 540 (which is the second electrode of the storage capacitor Cstg and does not overlap the semiconductor layer 520).

The gate portion 530a of the first plate 530 may overlap the semiconductor layer 520. The capacitor-forming portion 530b of the first plate 530 may overlap the second plate 540. The gate portion 530a and the capacitor-forming portion 530b may form the storage capacitor Cstg.

Meanwhile, the transistor DT may be the driving transistor DT for driving the organic light emitting diode (OLED) in the pixel, but embodiments are not limited thereto. Although the structures of the illustrated embodiments show a top-gate type in which the gate portion 530a is positioned on the semiconductor layer 520, embodiments are not limited thereto, and they may adopt a bottom-gate type.

The semiconductor layer 520 of the transistor DT may include an area that is connected with the source electrode or the drain electrode 550 and 550' of the transistor DT and may include an active area or an activation area. In addition, the semiconductor layer 520 may be formed from low temperature polysilicon. The semiconductor layer 520 of low temperature polysilicon has a low serial resistance in the active area and gate insulator thereof can be formed to be thin. Therefore, in the organic light emitting display panel 140 using the semiconductor layer 520 of low temperature polysilicon, the driving circuit can be built in the panel and the driving voltage may be relatively low to provide a high-resolution product.

Meanwhile, the gate portion 530a of the first plate 530 may play the role of the gate electrode of the transistor DT. The gate portion 530a may be formed to be integral with the capacitor-forming portion 530b and may overlap the semiconductor layer 520. That is, the first plate 530b may include the gate portion 530a that overlaps the semiconductor layer 520, and the capacitor-forming portion 530b that overlaps the second plate 540. Further, the gate portion 530a may be made, e.g., of at least one of Al, Pt, Pd, Ag, Mg, Au, Ni, Nd, Ir, Cr, Li, Ca, Mo, Ti, W, and Cu, or an alloy thereof, but embodiments are not limited thereto.

The first plate 530 and the second plate 540 thereon may form the storage capacitor Cstg. For example, the first plate 530 may act as the first electrode of the storage capacitor Cstg, and the second plate 540 may act as the second electrode of the storage capacitor Cstg. The storage capacitor Cstg may maintain the data voltage for one frame. The second plate 540 may be made of at least one metal or an alloy. Meanwhile, although the structures of the semiconductor layer 520, the first plate 530, and the second plate 540 are illustrated in detail in FIG. 5 for the convenience of explanation, they may be variously designed.

Figure 7:
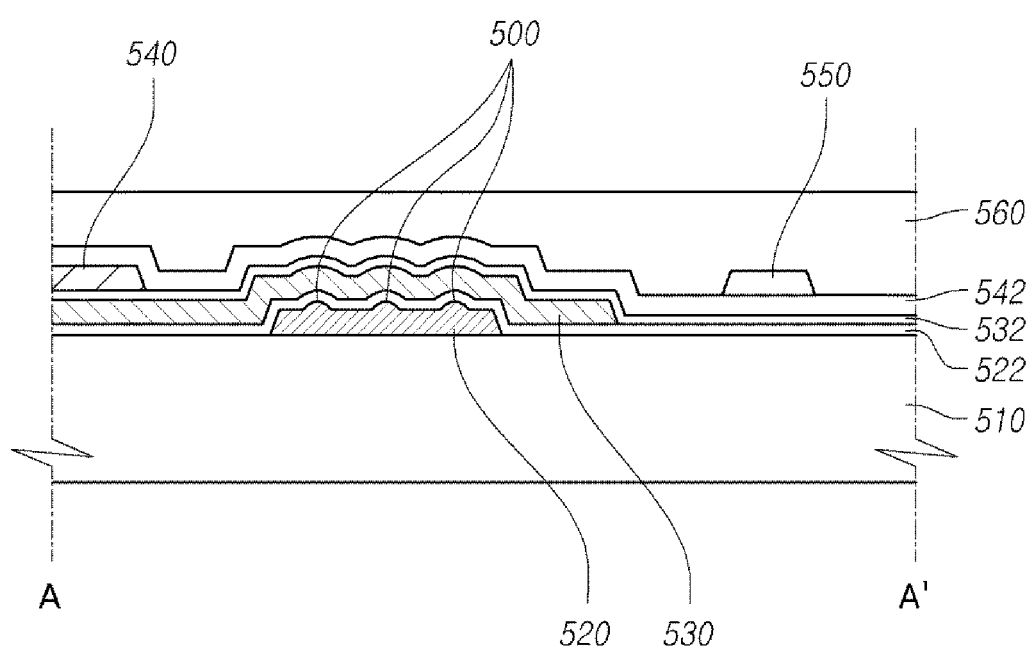
FIG. 7 is a partial sectional view of a pixel of an organic light emitting display panel according to an embodiment.

FIG. 7 is a partial sectional view of a pixel of an organic light emitting display panel 140, along the lines A-A' of FIG. 5, according to an embodiment.

With reference to the FIG. 7 example, the organic light emitting display panel 140, according to an embodiment, may include a plurality of pixels P that may be defined by the respective intersections of a plurality of data lines and a plurality of gate lines. Each pixel P includes the transistor DT and the storage capacitor Cstg of FIG. 5. Each pixel P may further include a semiconductor layer 520, the first plate 530 on the semiconductor layer 520 (which may be formed with a gate portion 530a of the transistor DT and a capacitor-forming portion 530b as the first electrode of the storage capacitor Cstg) and the second plate 540 on the first plate 530 (which may be the second electrode of the storage capacitor Cstg and may not overlap the semiconductor layer 520).

In addition, the organic light emitting display panel 140 may further include the first insulator 522 formed between the semiconductor layer 520 and the gate portion 530a, the second insulator 532 formed between the capacitor-forming portion 530b and the second plate 540, and the third insulator 542 formed on the second plate 540. Meanwhile, the organic light emitting display panel 140 may further include the source electrode or the drain electrode 550 of the transistor, which may be formed on the first plate 530 at the area opposite to the second plate 540. Further, a flattening layer 560 may be formed to cover the third insulator 542, the source electrode or the drain electrode 550.

As an example, the substrate 510 may be a plastic substrate, e.g., polyethylene terephthalate (PET), polyethylennaphthalate (PEN), and polyimide, or may be a glass substrate. A buffering layer (not shown) may be further provided on the first substrate 510 for preventing penetration of impurities. For example, the buffering layer may be formed of a single layer or a multilayer of silicon nitrides or silicon oxides. In the case of the semiconductor layer 520 of low temperature polysilicon, the buffering layer may be made, e.g., of $SiO_2$ that has a good surface property. Meanwhile, the semiconductor layer 520 formed on the substrate 510 may be made of low temperature polysilicon. It should be appreciated that embodiments are not limited to these example materials.

At least one protrusion 500 may be formed on the surface of the semiconductor layer 520. For example, the protrusions 500 may result from the manufacturing process of low temperature polysilicon. As an example, the low temperature polysilicon layer may be manufactured through the process of depositing amorphous silicon on the substrate 510 or the buffering layer by using plasma enhanced chemical vapor deposition (PECVD) and exposing the same to an excimer laser for re-crystallization. At this time, the protrusions 500 may stem from the grains that are crystals of silicon, which may be captured on the surface of the semiconductor layer, e.g., from the gain boundary of the grains of the re-crystallized silicon. The protrusions 500 are illustrated for the convenience of explanation in FIG. 7, and the shape, the size or the number thereof may vary.

Meanwhile, the gate portion 530a may be formed to correspond to the shape of the surface of the semiconductor layer 520. The gate portion 530a may be formed to conform to the shape of the protrusion 500 of the semiconductor layer 520 by a deposition process. Also, the first insulator 522, the second insulator 532, and the third insulator 542 may be made, e.g., of non-organic insulating materials, such as $SiO_x$, $SiN_x$, SiON, $Al_2O_3$, $TiO_2$, $Ta_2O_5$, $HfO_2$, $ZrO_2$, BST, and PZT, or organic insulating materials including benzocyclobutene (BCB) and acryl-based resin, or a combination thereof.

In addition to the above-described gate portion 530a, the portions of the first insulator 522, the second insulator 532, and the third insulator 542, which may overlap the semiconductor layer 520, may be formed to correspond to the shape of the surface of the semiconductor layer 520. The first insulator 522, the second insulator 532, and the third insulator 542 may be formed to be thin, e.g., by using chemical vapor deposition (CVD) or physical vapor deposition (PVD), so the surface shape of the lower layer may be reflected.

Meanwhile, the source electrode or the drain electrode 550 may be formed on the first plate 530 of the organic light emitting display panel 140 at the area opposite to the second plate 540. That is, as shown in the example of FIG. 7, the source electrode or the drain electrode may be formed at the area opposite to the area where the second plate 540 is formed, on the third insulator 542, with the semiconductor layer 520 at the center. The source electrode or the drain electrode 550 may be formed to be a single layer or a multilayer made of one of, for example, Al, Pt, Pd, Ag, Mg, Au, Ni, Nd, Ir, Cr, Li, Ca, Mo, Ti, W, and Cu, or an alloy thereof. For example, the source electrode or the drain electrode may be made of metal having a high melting point, such as chromium (Cr) or tantalum (Ta), but it is not limited thereto.

The flattening layer 560 may be formed on the third insulator 542 and the source electrode or the drain electrode 550, to flatten the pixel P of the panel 140. Considering, for example, the mechanical strength, the penetrating moisture proof, the easy formation of layers and the productivity, the flattening layer 560 may be made of one of, e.g., a photo acryl-based material, SiON, silicon nitrides ($SiN_x$), silicon oxides ($SiO_x$), and aluminum oxides ($AlO_x$), to be hydrophobic and a hydrogen-containing layer.

Figure 8:
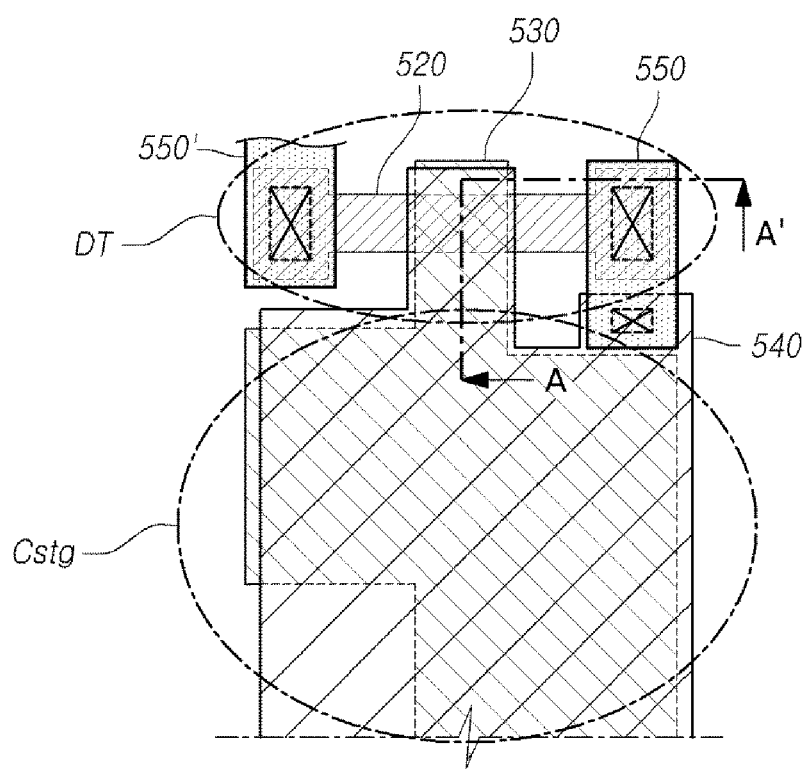
FIG. 8 is a partial sectional view of a pixel of an organic light emitting display panel according to an embodiment.
Figure 9:
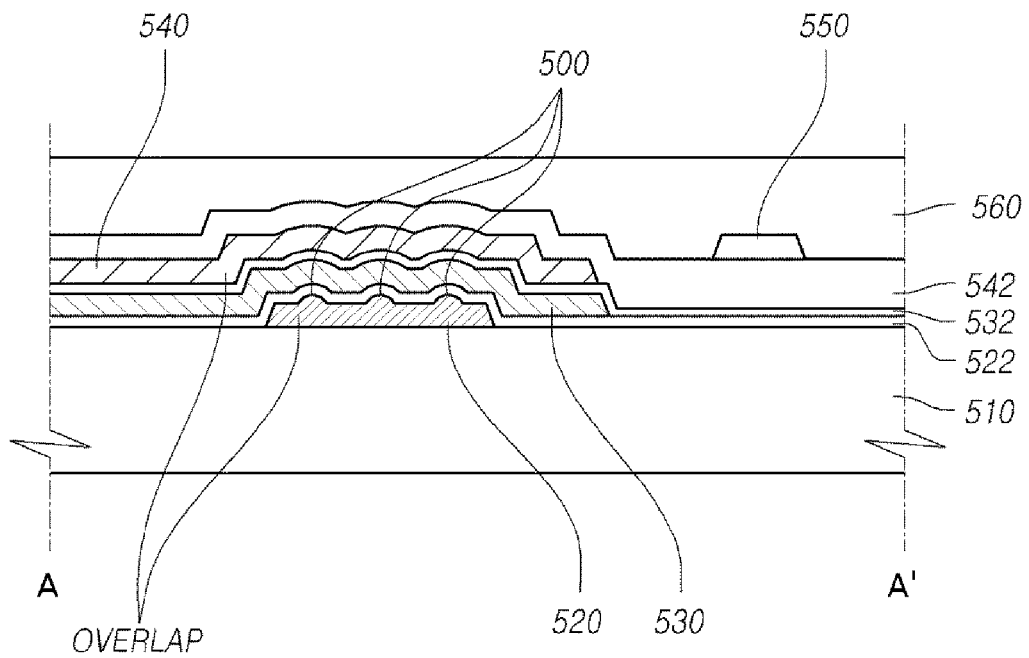
FIG. 9 is a partial sectional view of a pixel of an organic light emitting display panel according to an embodiment.

FIG. 8 is a partial sectional view of a pixel of an organic light emitting display panel 140 according to an embodiment. FIG. 9 is a partial sectional view of a pixel of an organic light emitting display panel 140 according to an embodiment.

With reference to the examples of FIGS. 8 and 9, the organic light emitting display panel 140, according to an embodiment, may include a semiconductor layer 520, a transistor DT including the first plate 530 on the semiconductor layer 520, and the second plate 540 on the first plate 530. The organic light emitting display panel 140 may further include the storage capacitor Cstg formed by the first plate 530 and the second plate 540, which overlap each other.

In one example, the transistor DT may be the driving transistor DT, but embodiments are not limited thereto. Further, the illustrated transistor DT may have a top-gate structure, but embodiments are not limited thereto.

The semiconductor layer 520 of the transistor DT may include an area that is connected with the source electrode or the drain electrode 550 and 550', and may include an active area or an activation area. Also, the semiconductor layer 520 may be made of low temperature polysilicon.

The second plate 540 of the organic light emitting display panel 140, according to an embodiment, overlaps the semiconductor layer 520 of the transistor DT in part, and the first plate 530 and the second plate 540 may entirely overlap each other. Accordingly, the capacitance of the storage capacitor Cstg in the FIG. 8 example may become larger than in the FIG. 5 example. Further, the area where the storage capacitor Cstg is formed except for the area where the transistor is formed may be reduced. As such, the non-aperture area may be reduced to enhance the aperture ratio.

Figure 10A:
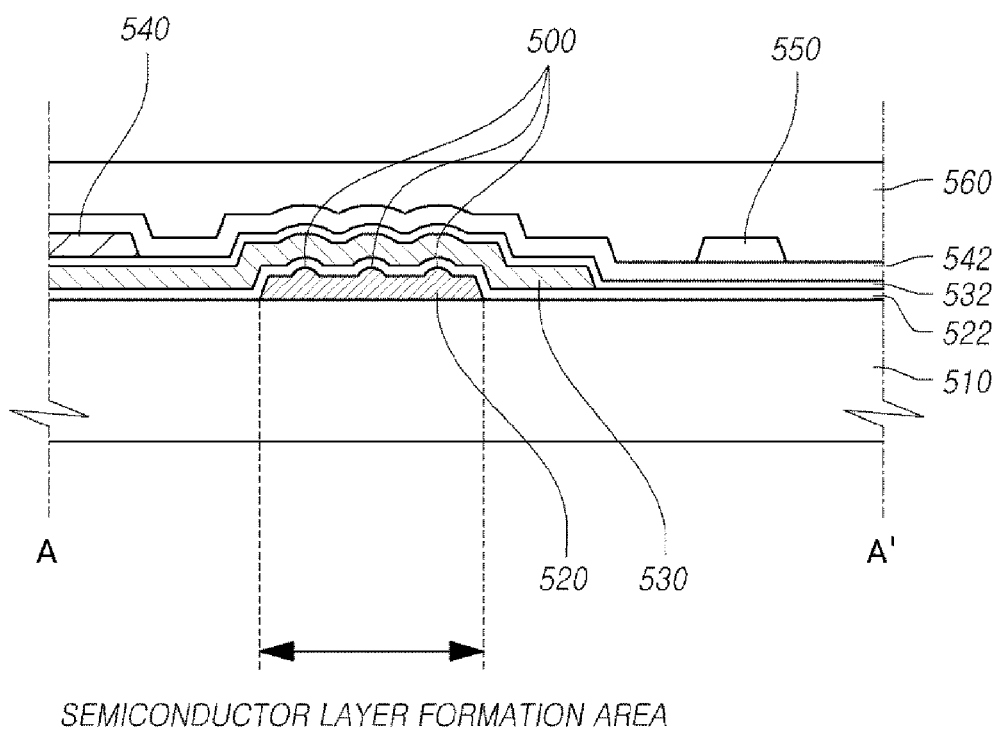
FIGS. 10A and 10B illustrate partial sectional views of a structure of the second plate in the pixel of the organic light emitting display panel according to an embodiment.
Figure 10B:
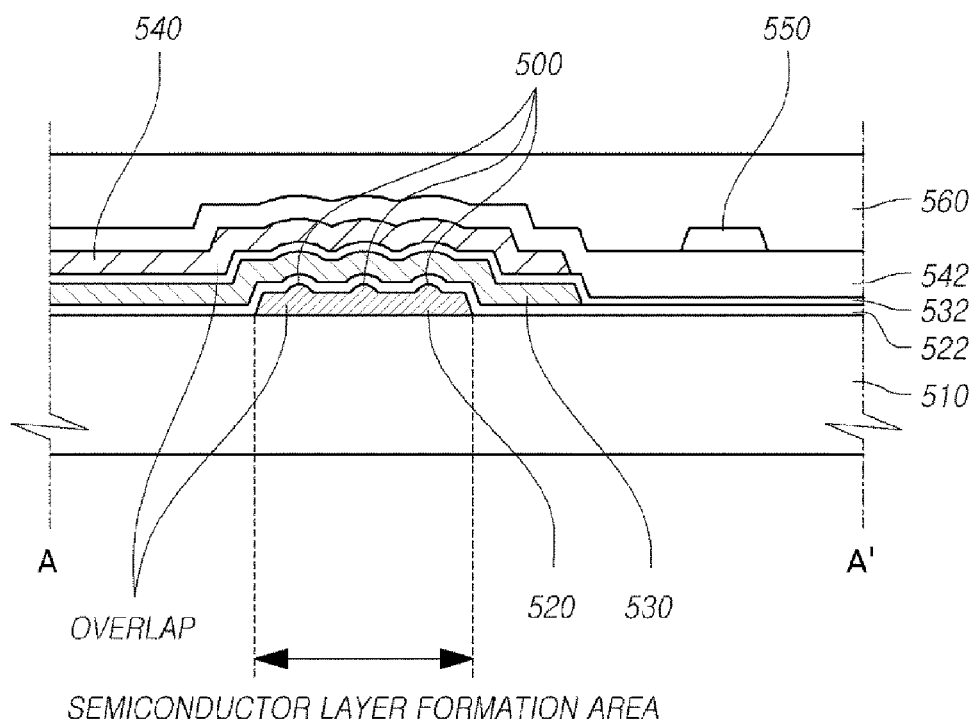

FIGS. 10A and 10B illustrate partial sectional views of a structure of the second plate 540 in the pixel of the organic light emitting display panel 140 according to an embodiment.

With reference to the examples of FIGS. 10A and 10B, the organic light emitting display panel 140, according to an embodiment, may include a semiconductor layer 520 formed on the substrate 510, a transistor DT including the first plate 530 on the semiconductor layer 520, and the second plate 540 on the first plate 530. In addition, the organic light emitting display panel 140 may further include the first insulator 522 formed between the semiconductor layer 520 and the gate portion 530a, the second insulator 532 formed between the capacitor-forming portion 530b and the second plate 540, and the third insulator 542 formed on the second plate 540. In one example, the transistor DT may be the driving transistor or the low temperature polysilicon transistor (LTPS TFT).

FIG. 10A shows that the second plate 540 may not overlap the semiconductor layer 520. FIG. 10B shows that the second plate 540 may overlap the semiconductor layer 520. The semiconductor layer 520 may be made of low temperature polysilicon. In one example, a plurality of protrusions 500 may be formed, e.g., due to the grain boundary during the formation of the low temperature polysilicon, as set forth before. Accordingly, the thickness of the semiconductor layer 520 in the surface direction (longitudinal direction in the drawing) is not constant. That is, a curvature may be created on the surface of the semiconductor layer 520, so the first plate 530, the first insulator 522, the second insulator 532, and the third insulator 542 may be formed to correspond to the surface shape of the semiconductor layer 520 at the portions that overlap the semiconductor layer 520.

In an example in which the second plate 540 overlaps the semiconductor layer 520, the transistor DT may have degraded electrical properties. For example, the semiconductor layer 520 may be deteriorated so that a multitude of trapping sites, in which silicon atoms are disconnected, may be created in the silicon band gap, to degrade an electrical property thereof. As a result, this may bring about an increase in threshold voltage and leakage current and a decrease in the field effect mobility. Further, the protrusions 500 may cause cracks in the first plate 530, the insulators 522, 532, 542, and the second plate 540, and degradation of the step coverage property. Consequently, when the organic light emitting display panel 140 is turned on, the above problems may result in the creation of a bunch of dark points to degrade brightness or a contrast ratio.

However, in an example in which the second plate 540 is formed to not overlap the semiconductor layer 520, degradation of the electric property of the transistor due to the protrusions 500 may be prevented. Accordingly, the organic light emitting display panel 140 may be operated at a low driving voltage with reduced leakage current to thereby prevent the creation of the dark points. Embodiments may prevent degradation of the electric property of the transistor to reduce the driving voltage and leakage current and prevent the creation of the black dots.

It will be apparent to those skilled in the art that various modifications and variations can be made in the present invention without departing from the spirit or scope of the invention. Thus, it is intended that embodiments of the present invention cover the modifications and variations of this invention provided they come within the scope of the appended claims and their equivalents.

What is claimed is:

1. An organic light emitting display panel, comprising:
    a pixel defined by an intersection of one of a plurality of data lines and one of a plurality of gate lines, the pixel comprising:
        a transistor;
        a storage capacitor comprising:
            a first electrode; and
            a second electrode; and
        a semiconductor layer;
    a first plate partially overlapping the semiconductor layer in the pixel, the first plate comprising:
        a gate portion of the transistor; and
        a capacitor-forming portion comprising the first electrode of the storage capacitor; and
    a second plate on the first plate in the pixel, the second plate comprising the second electrode of the storage capacitor, the second plate not overlapping the semiconductor layer.

2. The organic light emitting display panel of claim 1, wherein:
    the gate portion of the first plate overlaps the semiconductor layer; and
    the capacitor-forming portion of the first plate overlaps the second plate to form the storage capacitor.

3. The organic light emitting display panel of claim 1, wherein the transistor comprises a driving transistor configured to drive an organic light emitting diode (OLED) in the pixel.

4. The organic light emitting display panel of claim 1, wherein a source electrode or a drain electrode of the transistor is formed on the first plate at the area opposite to the second plate.

5. The organic light emitting display panel of claim 1, wherein the semiconductor layer comprises low temperature polysilicon.

6. The organic light emitting display panel of claim 1, wherein a surface of the semiconductor layer comprises at least one protrusion.

7. The organic light emitting display panel of claim 6, wherein the at least one protrusion comprises grains captured on the surface of the semiconductor layer.

8. The organic light emitting display panel of claim 1, wherein the gate portion of the first plate corresponds to the shape of the surface of the semiconductor layer.

9. The organic light emitting display panel of claim 1, further comprising:
    a first insulator between the semiconductor layer and the gate portion;
    a second insulator between the capacitor-forming portion and the second plate; and
    a third insulator on the second plate.

10. The organic light emitting display panel of claim 9, wherein portions of the first insulator, the second insulator, and the third insulator, which overlap the semiconductor layer, correspond to the shape of the surface of the semiconductor layer.

\* \* \* \* \*